US006873143B2

United States Patent
Moon et al.

(10) Patent No.: US 6,873,143 B2
(45) Date of Patent: Mar. 29, 2005

(54) ON-CHIP REFERENCE CURRENT AND VOLTAGE GENERATING CIRCUITS

(75) Inventors: Kyoung-ho Moon, Kyungki-do (KR); Seung-hoon Lee, Seoul (KR); Jong-bum Park, Seoul (KR); Hee-seuk Yang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/368,398

(22) Filed: Feb. 20, 2003

(65) Prior Publication Data

US 2003/0155650 A1 Aug. 21, 2003

(30) Foreign Application Priority Data

Feb. 21, 2002 (KR) .............................................. 02-9324

(51) Int. Cl.⁷ .................................................. G05F 3/08

(52) U.S. Cl. ......................... 323/312; 323/314; 323/907

(58) Field of Search ................................. 323/312, 313, 323/314, 907

(56) References Cited

U.S. PATENT DOCUMENTS

| 4,928,056 A | * | 5/1990 | Pease ........................ 323/314 |
| 6,181,191 B1 | * | 1/2001 | Paschal ..................... 327/513 |
| 6,265,857 B1 | * | 7/2001 | Demsky et al. ............ 323/312 |
| 6,509,726 B1 | * | 1/2003 | Roh ........................... 323/313 |

* cited by examiner

Primary Examiner—Jeffrey Sterrett
(74) Attorney, Agent, or Firm—Harness, Dickey & Pierce, P.L.C.

(57) ABSTRACT

Provided is an on-chip reference current generating circuit for generating a reference voltage that can be digitally calibrated and is substantially not affected by changes in temperature and/or supply voltage. The on-chip reference current generating circuit includes a summing circuit for receiving a first current having a negative temperature coefficient and a second current having a positive temperature coefficient, and outputting a third current based upon, is a sum of, the first and second currents; and a digital calibration circuit for calibrating the third current to be the reference current in response to a digital control signal. Using the on-chip reference current generating circuit, it is possible to precisely and digitally calibrate an offset between currents due to a change in temperature and/or supply voltage.

14 Claims, 10 Drawing Sheets

FIG. 10

| MANUFACTURING PROCESS | 0.35μm N-WELL CMOS |
|---|---|
| SUPPLY VOLTAGE | 2.4V~3.6V |
| TEMPERATURE RANGE (25°C~100°C) | 68 ppm/°C (CURRENT) 0.6 ppm/°C (VOLTAGE) |
| SUPPLY VOLTAGE RANGE (2.4V~3.6V) | ±0.2 %/V (CURRENT) ±0.1 %/V (VOLTAGE) |
| POWER CONSUMPTION | 2.63 mW (AT 2.75V) |
| ACTIVE AREA | 500μm X 300μm |

ON-CHIP REFERENCE CURRENT AND VOLTAGE GENERATING CIRCUITS

CROSS-REFERENCE TO RELATED APPLICATIONS

This application is based upon and claims priority from Korean Patent Application No. 2002-9324 filed Feb. 21, 2002, the contents of which are incorporated herein by reference.

BACKGROUND OF THE INVENTION

1. Field of the Invention

The present invention relates to an integrated circuit, and more particularly, to an integrated circuit that includes a reference current generating circuit for generating a digitally calibrated reference current and a reference voltage generating circuit having an on-chip reference voltage driving circuit, which minimizes power consumption and a chip area.

2. Description of the Related Art

In general, reference current and voltage generating circuits are capable of generating a steady reference current and voltage, regardless of or independently of a change in temperature and/or supply voltage.

Reference current and voltage generating circuits are useful with analog signal processing apparatuses or systems having a data converter, a memory, a highly sensitive sensor and the like. The reference voltage generating circuit includes a voltage driving circuit for driving a reference voltage with a data converter connected to an output terminal of the reference voltage generating circuit.

The reference current and voltage generating circuits can generate a predetermined current and/or voltage with a small amount of power for a long time, irrespective of a change in the supply voltage and/or ambient temperature. Accordingly, these circuits are useful with analog signal processing systems.

Further, the higher the resolution of a high-speed, high-resolution analog-to-digital (A/D) converter or digital-to-analog (D/A) converter, the more exact the reference current and voltage are required to be, regardless of changes in the power source and/or temperature.

An integrated circuit, which has reference current and voltage generating circuits that are manufactured using a complementary metal-oxide semiconductor (CMOS) process, may generate a reference current that is not the same as a desired reference current. This is due to a change in manufacturing process parameters during a manufacturing process. That is, there is an offset between an actual reference current generated by the reference current generating circuit, and a desired reference current.

Conventionally, such an offset is removed by connecting a resistor to the outside of the integrated circuit. However, this method fails to completely remove the offset. Further, noise from the outside may enter the integrated circuit via a pin of the integrated circuit to which the resistor is connected, thereby causing malfunction of the integrated circuit.

In the event that a CMOS switched capacitor is connected to an output terminal of the voltage driving circuit (or an output terminal of the reference voltage generating circuit), glitch energy is generated at an output node of the reference driving circuit when turning the CMOS switched capacitor on and off. As a result, high-frequency noise is generated.

The high-frequency noise is removed using a capacitor of a large capacity, e.g., a capacitor of 0.5 nF or more, or a voltage driving circuit that operates at a high speed comparable to the whole system of the integrated circuit while connecting a large-capacity capacitor to the outside of the integrated circuit.

However, the integration of a capacitor of a large capacity into an integrated circuit increases the size of the integrated circuit considerably. In addition, the use of a voltage driving circuit having a similar operational speed to that of the whole system increases the power consumption of the voltage driving circuit and the integrated circuit.

SUMMARY OF THE INVENTION

To solve the above problem, an embodiment of the present invention provides an on-chip reference current generating circuit for generating a steady reference current that can be digitally calibrated and is substantially not affected by a change in temperature and/or supply voltage.

An embodiment of the present invention provides an on-chip reference voltage generating circuit that has a small size and operates with very little power but generates steady reference current substantially irrespective of a change in temperature and/or supply voltage.

An embodiment of the present invention provides an integrated circuit including such reference current and voltage generating circuits.

An embodiment of the present invention provides an on-chip reference current generating circuit for outputting a steady reference current substantially irrespective of a change in temperature and/or supply voltage, the on-chip reference current generating circuit including a summing circuit for receiving a first current having a negative temperature coefficient and a second current having a positive temperature coefficient, and outputting a third current based upon, e.g., is a sum of, the first and second currents; and a digital calibration circuit for calibrating the third current to be the reference current in response to a digital control signal.

Another embodiment of the invention provides an on-chip reference voltage driving circuit having an output terminal for outputting a reference voltage, the circuit including an amplifier for comparing the reference voltage, which is input to a first input terminal, and an input voltage input to a second input terminal and outputting the result of the comparison to the output terminal of the amplifier; an on-chip capacitor connected between the output terminal of the amplifier and the output terminal of the on-chip reference voltage driving circuit; and a common source amplifier for outputting the reference voltage to the output terminal of the on-chip reference voltage driving circuit in response to a signal output from the amplifier.

Another embodiment of the invention provides an on-chip reference voltage generating circuit having an output terminal for outputting a reference voltage, the circuit including a level shifter for generating a second voltage by shifting the level of a first voltage in response to the first voltage; and a voltage driving circuit for driving the second voltage to the reference voltage in response to an enable signal. Here, the voltage driving circuit includes an amplifier for comparing the reference voltage input to its first input terminal and the second voltage input to its second input terminal, and outputting the result of the comparison to its output terminal; an on-chip capacitor connected between the output terminal of the amplifier and the output terminal of the on-chip reference voltage generating circuit; and a common source amplifier for driving the reference voltage to the output terminal of the on-chip reference voltage generating circuit in response to a signal output from the amplifier.

Another embodiment of the invention provides an integrated circuit including a summing circuit for receiving a first current, which increases in proportion to temperature, and a second current, which decreases in inverse proportion to temperature, and outputting a third current based upon, e.g. is a sum of, the first and second currents; a digital calibration circuit for calibrating the third current with reference to a predetermined reference current in response to a digital control signal and outputting a reference current; and an internal reference voltage generating circuit for receiving the reference current and generating an internal reference voltage corresponding to the reference current.

Another embodiment of the invention provides an integrated circuit including a first current generating circuit for generating a first current that decreases in inverse proportion to temperature; a second current generating circuit for generating a second current that increases in proportion to temperature; a summing circuit for generating a third current based upon, e.g., is a sum of, the first and second currents; and a digital calibration circuit for calibrating an offset between the third current and the reference current with reference to a predetermined reference current in response to a digital control signal input from the outside, and outputting the calibrated reference current.

Additional features and advantages of the invention will be more fully apparent from the following detailed description of example embodiments, the appended claims and the accompanying drawings.

BRIEF DESCRIPTION OF THE DRAWINGS

The above objects and advantages of the present invention will become more apparent by describing in detail preferred embodiments thereof with reference to the attached drawings in which:

FIG. 10 is a table illustrating the characteristics of on-chip reference current and voltage generating circuits according to preferred embodiments of the present invention.

DETAILED DESCRIPTION OF THE INVENTION

Figure 1:
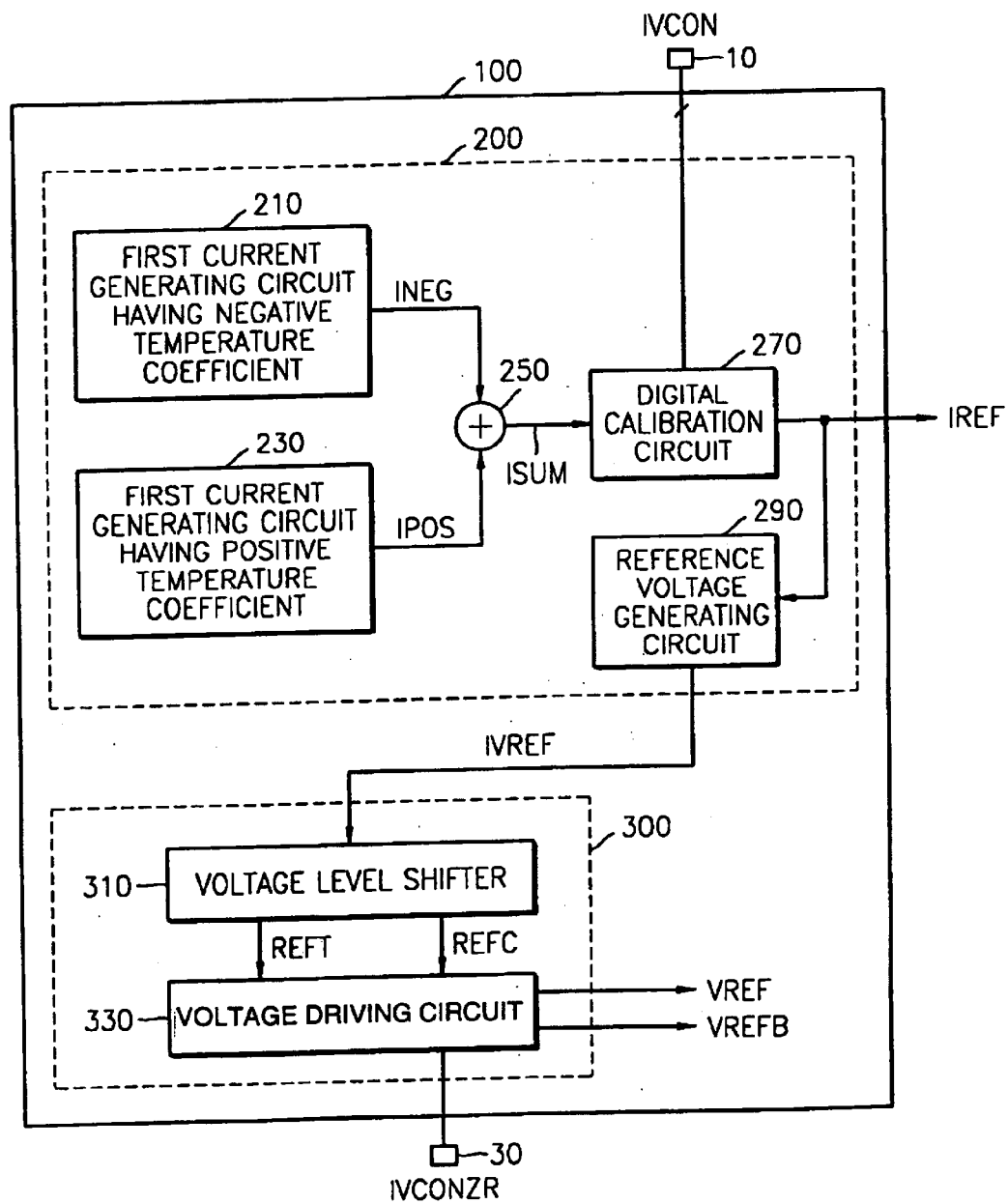
FIG. 1 is a block diagram of an embodiment of an integrated circuit including reference current and voltage generating circuits according to the present invention.

FIG. 1 is a block diagram of an embodiment of an integrated circuit 100 (or semiconductor chip) having a reference current generating circuit 200 and a reference voltage generating circuit 300.

The reference current and voltage generating circuits 200 and 300 generate a steady reference current IREF and a steady reference voltage VREF, respectively, substantially irrespective of changes in supply voltage and/or temperature, and supply them to a predetermined circuit which uses the reference current IREF and/or reference voltage VREF.

The reference current generating circuit 200 includes first and second current generating circuits 210 and 230, a summing circuit 250, a digital calibration circuit 270, and an internal reference voltage generating circuit 290.

The first current generating circuit 210 generates a first current $I_{NEG}$ that decreases in inverse proportion to temperature, and outputs the first current $I_{NEG}$ to the summing circuit 250. The second current generating circuit 230 generates a second current $I_{POS}$ that increases in proportion to temperature, and outputs it to the summing circuit 250.

The summing circuit 250 receives the first and second currents $I_{NEG}$ and $I_{POS}$, sums them, and outputs a third current $I_{SUM}$ to the digital calibration circuit 270. Alternatively, the third current $I_{SUM}$ can be based upon some other combination of $I_{NEG}$ and $I_{POS}$.

The digital calibration circuit 270 outputs the steady reference current IREF, substantially irrespective of changes in temperature and/or supply voltage, in response to a digital control signal IVCON input via a pin 10 of the integrated circuit 100. In other words, the digital calibration circuit 270 digitally controls an offset between the reference current IREF and the third current $I_{SUM}$, which is due to a change in temperature and/or supply voltage, and generates the reference current IREF, which has a level that is substantially independent of temperature and/or supply voltage. Thus, the digital calibration circuit 270 can substantially completely remove an offset between the reference current IREF and the third current $I_{SUM}$ in response to the digital control signal IVCON.

The internal reference voltage generating circuit 290 receives the reference current IREF and generates an internal reference voltage IVREF corresponding to the reference current IREF. The structure and operations of the reference current generating circuit 200 will later be described in detail with reference to FIG. 2.

The reference voltage generating circuit 300 includes a level shifter 310 and a voltage driving circuit 330. The level shifter 310 generates voltages REFT and REFC by shifting the level of the internal reference voltage IVREF in response to the internal reference voltage IVREF, and outputs them to the voltage driving circuit 330.

The voltage driving circuit 330 converts the voltages REFT and REFC, which are output from the level shifter 310, into differential reference voltages VREF and VREFB in response to an enable signal INCONZR input via a pin 30 of the integrated circuit 100, and then outputs them to the outside.

Capacitors having a predetermined capacitance may be connected to output terminals of the voltage driving circuit 330. The capacitors are used to remove high-frequency noise. The structure and operations of the reference voltage generating circuit 300 will later be described in detail with reference to FIG. 3.

In conclusion, the integrated circuit 100 generates the reference current IREF and the reference voltage VREF, which are substantially independent of changes in temperature and/or supply voltage, in response to the control signals IVCON and IVCONZR input via the pins 10 and 30. Thereafter, the integrated circuit 100 outputs the reference current IREF and/or the reference voltage VREF to a data converter, memory, highly sensitive sensor, and the like.

Figure 2:
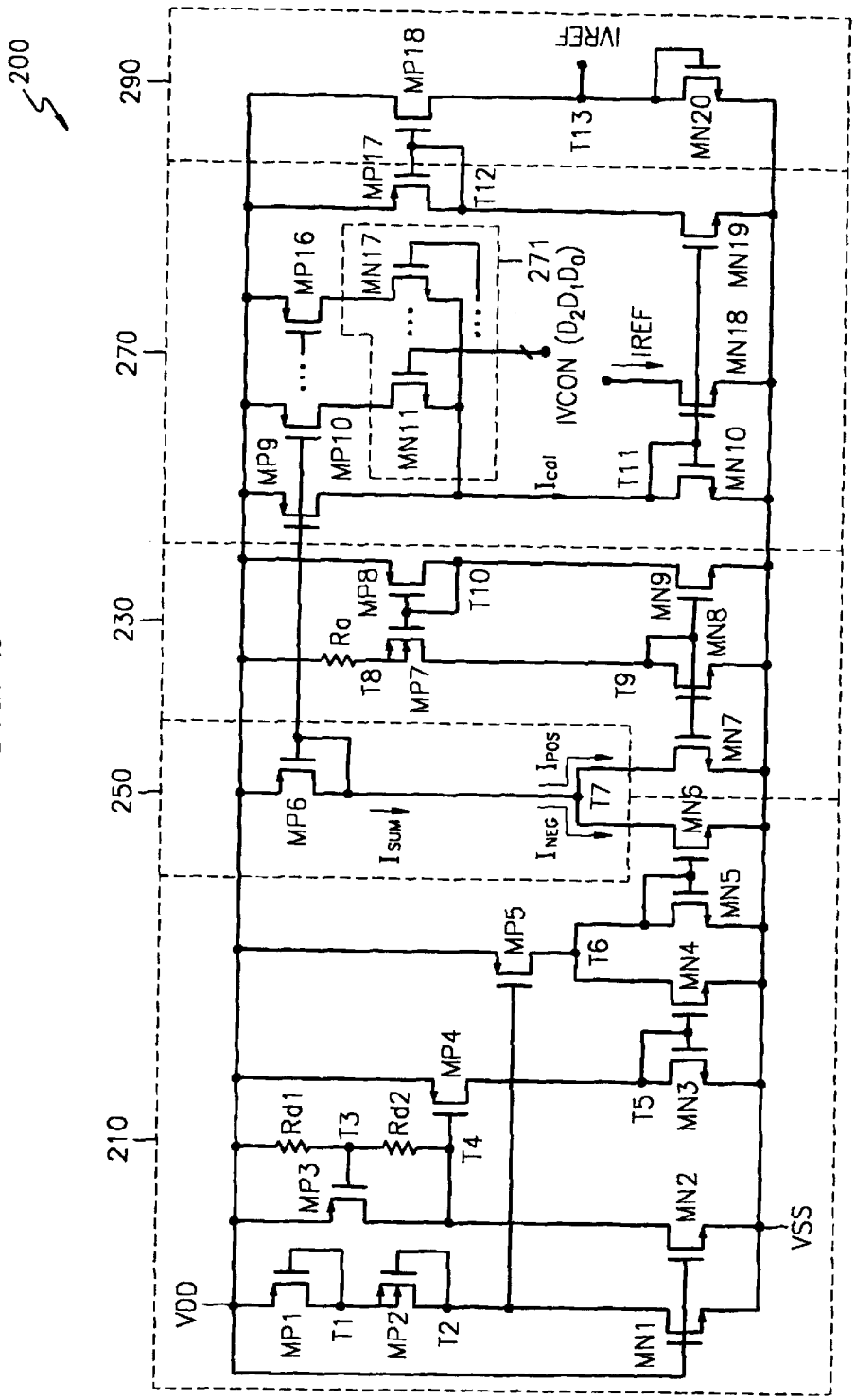
FIG. 2 is a circuit diagram of an embodiment of a reference current generating circuit according to the present invention.

FIG. 2 is a circuit diagram of one embodiment of a reference current generating circuit 200 according to the present invention. Hereinafter, the structure and operations of the reference current generating circuit 200 will be described in a greater detail.

A first current generating circuit 210 includes PMOS transistors MP1 through MP5, NMOS transistors MN1 through MN6, and resistors Rd1 and Rd2. A supply voltage VDD is input to gates of the transistors MN1 and MN2. The transistor MN1 is connected between a node T2 and a grounding voltage VSS and the transistor MN2 is connected between a node T4 and the grounding voltage VSS.

The transistor MP1 is connected between the supply voltage VDD and a node T1, and its gate is connected to the node T1. The transistor MP2 is connected between the nodes T1 and T2, and its gate is connected to the node T2. The substrate (or bulk) of the transistor MP2 is connected to the node T1.

The transistor MP3 is connected between the supply voltage VDD and the node T4, and its gate is connected to a node T3. The resistor Rd1 is connected between the supply voltage VDD and the node T3, and the resistor Rd2 is connected between the nodes T3 and T4. The transistor MP4 is connected between the supply voltage VDD and a node T5, and its gate is connected to the node T4.

The transistor MP5 is connected between the supply voltage VDD and a node T6, and its gate is connected to the node T2. The transistor MN3 is connected between the node T5 and the grounding voltage VSS, and its gate is connected to the node T5. The transistor MN4 is connected between the node T6 and the grounding voltage VSS, and its gate is connected to the node T5. Here, the transistors MN3 and MN4 constitute a current mirror.

The transistor MN5 is connected between the node T6 and the grounding voltage VSS, and its gate is connected to the node T6. The transistor MN6 is connected between a node T7 and the grounding voltage VSS, and its gate is connected to the node T6. A first current $I_{NEG}$ flows to the grounding voltage VSS via a drain of the transistor MN6. The transistors MN5 and MN6 also constitute a current mirror.

The first current generating circuit 210 generates the first current $I_{NEG}$ that decreases in inverse proportion to temperature. The first current $I_{NEG}$ is represented with functions of threshold voltages of the PMOS transistors MP1 through MP5 and a function of electron mobility, and threshold voltages of the transistors MP1 through MP5 is inversely proportional to temperature.

Therefore, the first current $I_{NEG}$ is substantially independent of changes in the supply voltage VDD but is dependent on changes in temperature, i.e., it has a negative temperature coefficient of several (−)mV/° C. That is, an increase in temperature results in a reduction in the first current $I_{NEG}$.

The second current generating circuit 230 includes PMOS transistors MP7 and MP8, NMOS transistors MN7 through MN9, and a resistor Ra. The second current generating circuit 230 generates a second current $I_{POS}$ that increases in proportion to temperature.

The resistor Ra is connected between the supply voltage VDD and a node T8. The transistor MP7 is connected between the node T8 and a node T9, and its substrate and gate are connected to the node T8 and a node T10, respectively. The transistor MP8 is connected between the supply voltage VDD and the node T10, and its gate is connected to the node T10.

The transistor MN7 is connected between the node T7 and the grounding voltage VSS. The gates of the transistors MN7 through MN9 are connected to the node T9. The transistor MN8 is connected between the node T9 and the grounding voltage VSS, and the transistor MN9 is connected between the node T10 and the grounding voltage VSS.

The second current $I_{POS}$ is represented with a function of a resistor Ra which has a resistance that is proportional to electron mobility, which is inversely proportional to temperature. That is, the second current $I_{POS}$ is dominantly affected by the electron mobility.

The second current $I_{POS}$ is substantially independent of changes in the supply voltage VDD but dependent on changes in temperature. That is, it has a positive temperature coefficient of several (+)mV/° C. and thus increases in proportion to temperature.

The summing circuit 250 outputs a third current $I_{SUM}$, which is a sum of the first and second currents $I_{NEG}$ and $I_{POS}$, to the digital calibration circuit 270 (at the gates of transistors MP9 through MP16, to be discussed below). The summing circuit 250 includes a PMOS transistor MP6 connected between the supply voltage VDD and the node T7. The gate of the PMOS transistor MP6 is connected to the node T7.

The digital calibration circuit 270 includes PMOS transistors MP9 through MP17 and NMOS transistors MN10 through MN19. The gates of the PMOS transistors MP9 through MP16 are connected to the node T7.

An N-bit (e.g., 3 bit) digital control signal IVCON (where N is a natural number), which is input from the outside of the integrated circuit 100 of FIG. 1, is input to the gates of each of the NMOS transistors MN11 through MN17. That is, each of the NMOS transistors MN11 through MN17 is turned on in response to the corresponding N-bit digital control signal IVCON.

The transistor MP9 is connected between the supply voltage VDD and a node T11, and the PMOS transistors MP10 through MP16 are connected to the NMOS transistors MN11 through MN17, respectively, in series. That is, the supply voltage VDD is electrically connected to the node T11 via the NMOS transistors MN11 through MN17 which are connected to the PMOS transistors MP10 through MP16, respectively. The NMOS transistors MN11 through MN17 may be manufactured to have substantially the same current driving capability or different scale, respectively.

The gates of the transistors MN10, MN18, and MN19 are connected to the node T11. More specifically, the transistor MN10 is connected between the node T11 and the grounding voltage VSS, the transistor MN18 is connected between an output terminal of the digital calibration circuit 270 and the grounding voltage VSS, and the transistor MN19 is connected between a node T12 and the grounding voltage VSS. A reference current IREF flows to the grounding voltage VSS via the drain of the transistor MN18. Also, the transistor MP17 is connected between the supply voltage VDD and the node T12, and its gate is connected to the node T12.

Here, the transistors MP6 and MP9, and the transistors MN10 and MN18 form current mirrors, respectively. Ideally, a current flowing through the drain of the transistor MP9 is the same as the third current $I_{SUM}$, and therefore, the reference current IREF is the same as the third current $I_{SUM}$.

Nonetheless, in fact, there is an offset between the reference current IREF and the third current $I_{SUM}$ due to a change in temperature and/or supply voltage. Therefore, each of the NMOS transistors MN11 through MN17 is turned on or off in response to an N-bit digital control signal IVCON (where N is a natural number) to remove the offset.

In the embodiment of FIG. 2, the digital control signal IVCON may vary in a range, e.g., from 000 to 111, with each one bit change resulting, e.g., in a 5 μA change in the reference current IREF. If the digital control signal IVCON is 000, all of the NMOS transistors MN11 through MN17 are turned off. In this case, the reference current IREF becomes substantially the same as the third current $I_{SUM}$.

On the other hand, if the digital control signal IVCON is 111, all of the NMOS transistors MN11 through MN17 are turned on. In this case, the NMOS transistors MN11 through MN17 let currents flow to the node T11. As a result, the offset between the reference current IREF and the third current $I_{SUM}$ is substantially removed. The larger the offset between the reference current IREF and the third current $I_{SUM}$, the larger the number of NMOS transistors MN11 through MN17 to be turned off.

The digital calibration circuit 270 calibrates the offset between the third current $I_{SUM}$ and the reference current IREF in response to the digital control signal IVCON input from the outside of the integrated circuit 100. The digital control signal IVCON can be determined based upon the reference current IREF. For example, under controlled conditions in which the calibration circuit 270 is exposed to a variety of temperatures, values of the reference current IREF (obtained in response to various values of IVCON) can be measured to determine a thermal behavior of the particular calibration circuit 270. Depending upon the magnitude of the deviation between what is expected for IREF and what is measured, the value of IVCON can be adjusted to minimize the deviation, thereby producing a calibrated version of IREF.

In other words, IVCON represents a feedback control signal used to substantially eliminate any offset between $I_{SUM}$ and IREF.

Therefore, the digital calibration circuit 270 is capable of substantially completely removing the offset and outputting the reference current IREF to a desired level substantially irrespective of changes in temperature and/or supply voltage.

The internal reference voltage generating circuit 290 includes a PMOS transistor MP18 and an NMOS transistor MN20. The transistor MP18 is connected between the supply voltage VDD and a node T13, and its gate is connected to the node T12. The transistor MN20 is connected between the node T13 and the grounding voltage VSS, and its gate is connected to the node T13. An internal reference voltage IVREF is output to the node T13.

The internal reference voltage generating circuit 290 receives the reference current IREF or a current flowing through the drain of the transistor MP17 and generates the internal reference voltage IVREF corresponding to the received current. The internal reference current generating circuit 290 can generate voltage substantially independently of changes in temperature and/or supply voltage, using the reference current IREF and an internal resistance in the NMOS diode MN20.

For this reason, the internal reference current IVREF is represented with a function of a threshold voltage of the NMOS transistor MN20, which decreases in inverse proportion to temperature, and a function of electron mobility. The above two functions have absolute values of several mV/° C. and their signs are opposite. The internal reference voltage IVREF, which is substantially independent of changes in temperature and/or supply voltage, is obtained by controlling the width W and/or length L of the NMOS transistor MN20.

Figure 3:
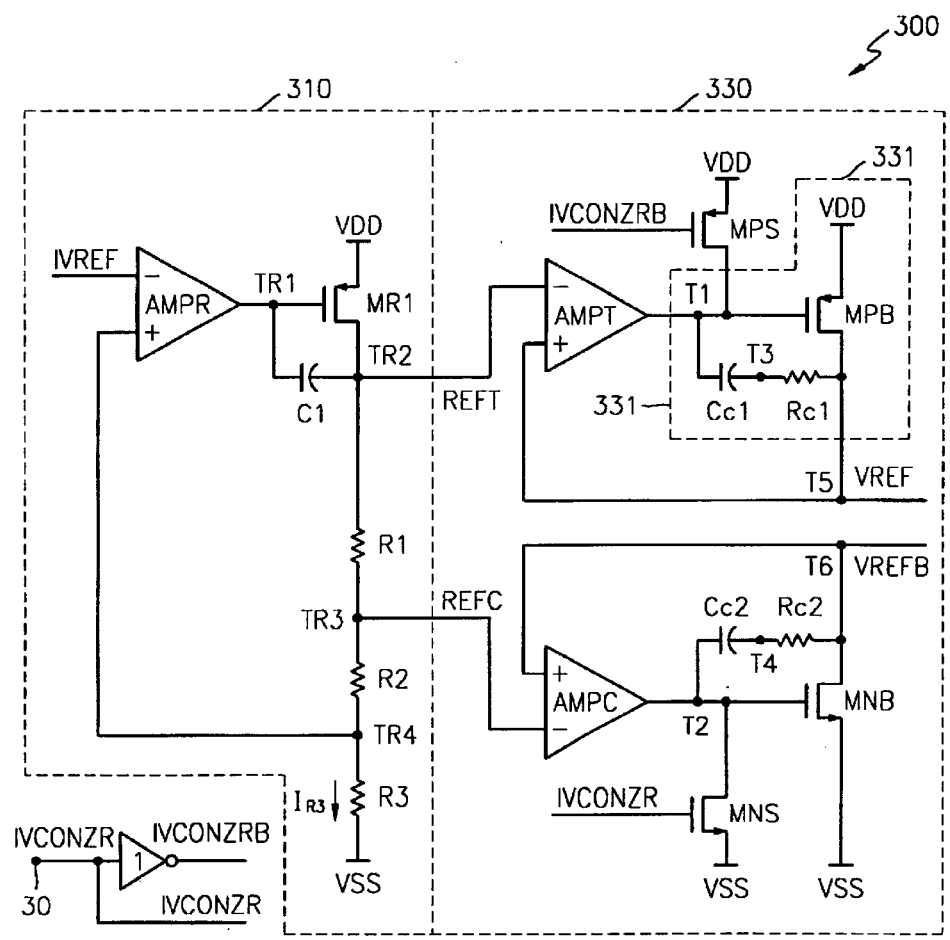
FIG. 3 is a circuit diagram of an embodiment of a reference voltage generating circuit according to the present invention.

FIG. 3 is a circuit diagram of one embodiment of a reference voltage generating circuit 300 according to the present invention. Referring to FIG. 3, the reference voltage generating circuit 300 includes a level shifter 310 and a voltage driving circuit 330.

The level shifter 310 includes an amplifier AMPR, a PMOS transistor MR1, a capacitor C1, and resistors R1, R2, and R3. The amplifier AMPR compares an internal reference voltage IVREF with the voltage of a node TR4, and outputs the result of the comparison to a node TR1.

A voltage of the node TR4 is input to a first input terminal of the amplifier AMPR and the internal reference voltage IVREF is input to a second input terminal of the amplifier AMPR. The gate of the PMOS transistor MR1 is connected to the node TR1 and the PMOS transistor MR1 is connected between a supply voltage VDD and a node TR2. The PMOS transistor MR1 pulls up or drives the node TR2 to the level of the supply voltage VDD in response to a signal output from the amplifier AMPR.

The capacitor C1 is connected between the nodes TR1 and TR2 and passes high-frequency noise. The resistor R1 is connected between the node TR2 and a node TR3, the resistor R2 is connected between the nodes TR3 and TR4, and the resistor R3 is connected between the node TR4 and a grounding voltage VSS.

The voltage level of the node TR4 is substantially the same as an internal reference voltage IVREF, and therefore, a current $I_{R3}$ is calculated using the voltage of the node TR4 and the resistor R3. Also, the voltage REFT of the node TR2 and the voltage REFC of the node TR3 are calculated by the current $I_{R3}$ and the resistors R1 and R2.

The level shifter 310 generates the voltages REFT and REFC at a ratio of resistances of the resistors R1, R2, and R3, and thus it can generate steady voltage substantially irrespective of changes in absolute values of the resistances caused by a manufacturing process.

That is, the level shifter 310 generates the voltages REFT and REFC by shifting the level of the internal reference voltage IVREF in response to the internal reference voltage IVREF, and outputs them to the voltage driving circuit 330.

The voltage driving circuit 330 includes amplifiers AMPT and AMPC, PMOS transistors MPS and MPB, NMOS transistors MNS and MNB, capacitors Cc1 and Cc2, and resistors Rc1 and Rc2. The voltage driving circuit 330 also includes a reference voltage driving circuit 331.

The amplifier AMPT compares voltage output from the node TR2 with the reference voltage VREF, amplifies the result of the comparison, and outputs the final result to a node T1. An inversion enable signal IVCONZRB is input to the gate of the transistor MPS, and the transistor MPS is connected between the supply voltage VDD and the node T1. The transistor MPS drives the node T1 to the level of the supply voltage VDD in response to the inversion enable signal IVCONZRB.

The gate of the transistor MPB is connected to the node T1, and the transistor MPB is connected between the supply voltage VDD and the node T5. The transistor MPB pulls up the node T5 to the level of the supply voltage VDD. The on-chip capacitor Cc1 is connected between the nodes T1 and T3, and the on-chip resistor Rc1 is connected between the nodes T3 and T5.

The amplifier AMPC compares the voltage REFC output from the node TR3 and the inversion reference voltage VREFB, amplifies the result of the comparison, and outputs the final result to the node T2. The enable signal IVCONZR is input to the gate of the transistor MNS, and the transistor MNS is connected between the grounding voltage VSS and the node T2. The transistor MNS drives the node T2 to the level of the grounding voltage VSS in response to the enable signal IVCONZR.

The gate of the transistor MNB is connected to the node T2, and the transistor MNB is connected between the grounding voltage VSS and the node T6. The transistor MNB pulls down the node T6 to the level of the grounding voltage VSS in response to the voltage of the node T2. The on-chip capacitor Cc2 is connected between the nodes T2 and T4, and the on-chip resistance Rc2 is connected between the nodes T4 and T6.

The capacitor Cc1 and the resistor Rc1 increase a time constant, and therefore, the charging/discharging time of the capacitor Cc1 increases. Thus, a high-frequency noise in the node T5 is transferred to the node T1 via the capacitor Cc1 and disappears rapidly via the PMOS transistor MPB without instantly charging or discharging the capacitor Cc1. The resistor Rc1, which is connected to the capacitor Cc1 in series, approximates the amplification degree of voltage Av to 1.

The settling time of the reference voltage VREF when the capacitor Cc1 and the resistor Rc1 are connected in series between the nodes T1 and T5, is faster and more stable than when only the capacitor Cc1 is connected between the nodes T1 and T5. The functions of the capacitor Cc2 and the resistor Rc2 are the same as those of the capacitor Cc1 and the resistor Rc1.

Also, the capacitors Cc1 and Cc2, and the resistors Rc1 and Rc2 are used to obtain a low output resistance for processing a high-frequency signal at a low-voltage power source, unlike in a method of compensating for frequency, which is adopted in a conventional two-stage amplifier.

In terms of frequency response, the conventional two-phase amplifier has a dominant pole at an output node of a one-phase amplifier and has a non-dominant pole at an output node of the two-phase amplifier.

The voltage driving circuit 330 according to the present invention has a bypass capacitor of, for example, 0.1 $\mu$F which is connected to the nodes T5 and T6, and thus has a dominant pole at the nodes T5 and T6 and a non-dominant pole at the nodes T1 and T2.

For this reason, the larger the capacitors Cc1 and Cc2, the smaller the distance between the dominant and non-dominant poles due to the Miller Effect. For convenience, the capacitors Cc1 and Cc2 having capacity of 2 pF, and the resistors Rc1 and Rc2 having resistance of 130 $\Omega$ are used in this embodiment. The sizes of the capacitors Cc1 and Cc2 and resistance of the resistors Rc1 and rc2 are not limited.

The amplifiers AMPT and AMPC are used to drive the MOS transistors MPB and MNB and remove low-frequency noise in the nodes T5 and T6, respectively. In other words, high-frequency noise passes through a capacitor having a large capacity, which is connected to the outside of the integrated circuit 100, and through the elements MPB, MNB, Cc1, Cc2, Rc1, and Rc2 installed in the integrated circuit 100. Thus, the amplifiers AMPT and AMPC are mainly used to remove low-frequency noise.

Therefore, the bandwidth of each of the amplifiers AMPT and AMPC does not need to be high, which reduces the power consumption thereof. The reference voltage generating circuit 300 connects a capacitor having a capacity of several $\mu$F to the outside of the integrated circuit 100 via the nodes T5 and T6 so as to remove high-frequency noise.

For instance, it is possible to effectively remove high-frequency noise using an outside capacitor having a capacitance of 0.1 $\mu$F or more. The reference voltage generating circuit 300 according to an embodiment of the present invention can apply an enable signal IVCONZR from the outside of the integrated circuit 100 to apply a reference voltage having a predetermined size from the outside of the integrated circuit 100.

If the enable signal IVCONZR is activated, for example, to a high level, the nodes T5 and T6 have a high impedance. Thus, it is possible to apply an analog reference voltage directly from the outside of the integrated circuit 100.

Figure 4:
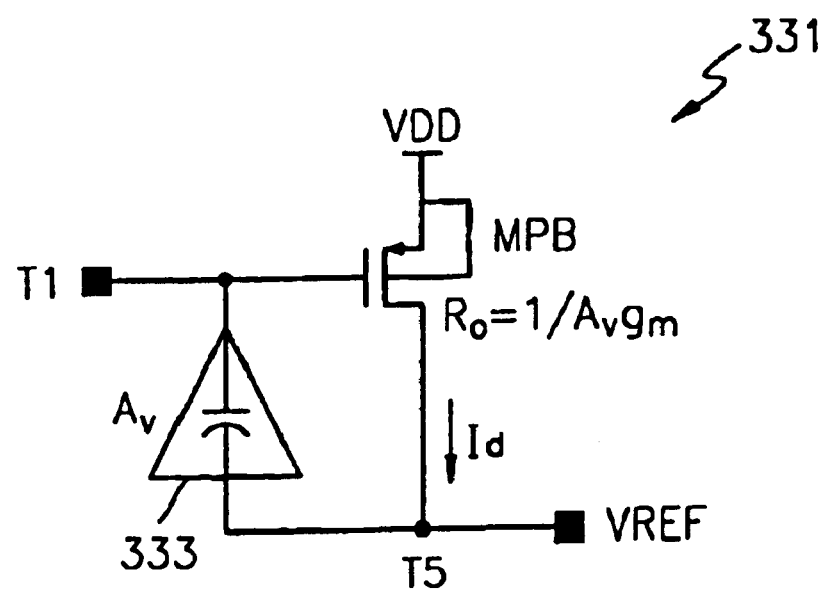
FIG. 4 is a schematic view of an embodiment of a reference voltage driving circuit according to the present invention.

FIG. 4 illustrates an embodiment of the reference voltage driving circuit 331 shown in FIG. 3, according to the present invention. Referring to FIG. 4, the reference voltage driving circuit 331 includes a common source amplifier (MPB) and a capacitor 333.

The common source amplifier MPB is connected between a supply voltage VDD and a node T5, and the capacitor 333 is connected between a node T1 and the node T5. A bias voltage is input to the gate of the common source amplifier MPB via the node T1. The common source amplifier MPB can operate with a small supply voltage and further is not substantially affected by the body effect.

An output current Id, a reference voltage VREF, and an output resistance value $R_o$ are expressed below by equations 1, 2, and 3, respectively. Here, since the output resistance value $R_o$ is 1/Avgm, the output resistance value $R_o$ of the common source amplifier MPB becomes almost the same as an output resistance value of a common drain amplifier when a voltage gain AV approximates 1.

$$Id = \frac{\mu_p}{2} Cox(W/L)(Vsg - |Vthp|)^2 \quad (1)$$

$$= \frac{\mu_p}{2} Cox(W/L)(VDD - Av \times VREF - |Vthp|)^2$$

wherein $\mu_p$ denotes hole mobility, Cox denotes the capacitance of a gate, W denotes the width of a channel, and L denotes the length of a channel. Also, Vthp denotes the threshold voltage of a PMOS transistor, and Av denotes a voltage gain.

$$VREF = \frac{VDD - |Vthp| - \sqrt{\frac{2ID}{\mu_p Cox(W/L)}}}{Av} \quad (2)$$

$$Ro = \frac{\partial Vds}{\partial Id} = \frac{\partial(VDD - VREF)}{\partial Id}$$

$$= \frac{\partial \left| VDD - \left\{ \frac{VDD - |Vthp| - \sqrt{\frac{2Id}{\mu_p Cox(W/L)}}}{Av} \right\} \right|}{\partial Id} \quad (3)$$

$$= \sqrt{\frac{1}{2\mu_p Cox(W/L)Av^2 Id}} = \frac{1}{Avgm}$$

wherein Vds denotes the voltage between a drain and a source.

If the capacitor 333 of FIG. 4 is replaced with an amplifier, the voltage gain Av in equation 3 may be larger than 1. In this case, an amplifier operating at several tens to several hundreds of MHz, depending on the specifications of a circuit, is required to remove high-frequency noise. Therefore, the layout area of a conventional voltage driving circuit increases, and further, power consumption by the reference voltage driving circuit 331 increases.

However, the reference voltage driving circuit 331 according to an embodiment of the present invention includes the capacitor 333 having a small capacity rather than a high-speed amplifier, which allows the layout area of the reference voltage driving circuit 331 to be less than that of a conventional reference voltage driving circuit. Also, power consumption of the reference voltage driving circuit 331 is much less than that of a conventional reference driving circuit while the voltage gain Av is maintained to be 1.

Since the impedance of the capacitor 333 of FIG. 4 is 1/sC, the impedance of the capacitor 333 when it has a value of several pF closely approximates 0 at high frequency, i.e., a frequency of more than several hundred MHz. Therefore, generation of high-frequency noise of several hundred MHz makes the impedance of the capacitor 33 closely approximate 0, and thus, the voltage gain Av of the capacitor 333 is 1.

Referring to FIGS. 3 and 4, the on-chip reference voltage driving circuit 330, which has an output terminal for outputting the reference voltage VREF, includes the amplifier AMPT that compares the reference voltage VREF input to a first input terminal and an input voltage REFT input to a second input terminal, and outputs the result of the comparison to an output terminal, i.e., the node T1; the on-chip capacitor 333 that is connected between the node T1 of the amplifier AMPT and the output terminal of the on-chip reference voltage driving circuit 330; and the common source amplifier MPB that outputs the reference voltage VREF to the output terminal of the on-chip reference voltage driving circuit 330 in response to a signal output from the amplifier AMPT.

Figure 5A:
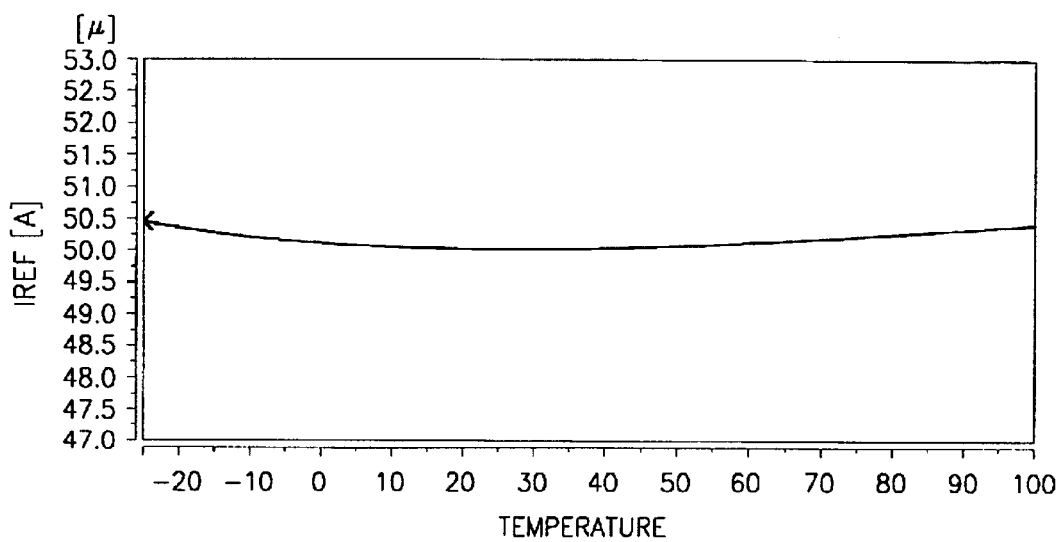
FIG. 5A is a graph illustrating a variation in reference current according to temperature.
Figure 5B:
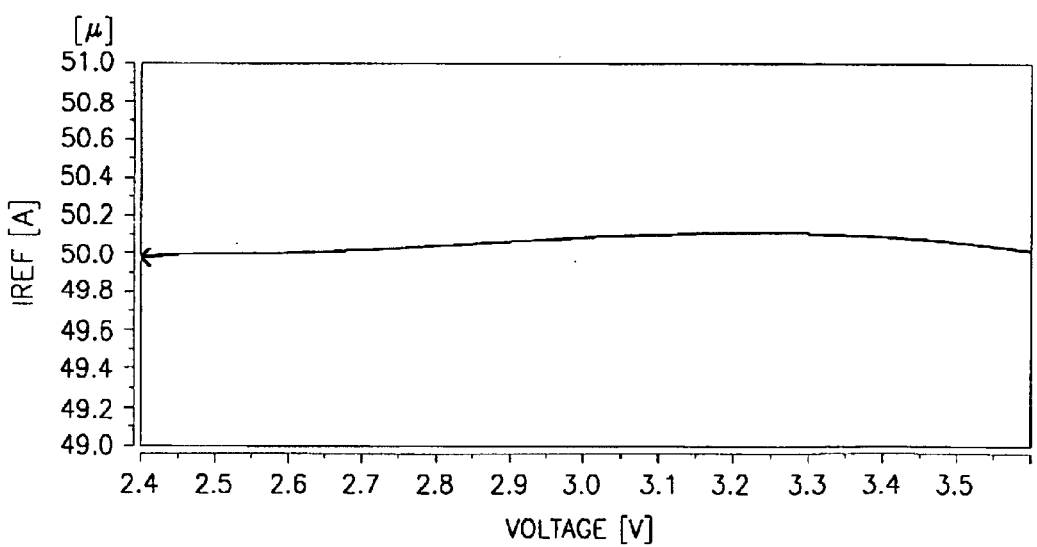
FIG. 5B is a graph illustrating a variation in reference current according to supply voltage.

FIGS. 5A and 5B are graphs illustrating a variation in reference current IREF according to temperature, and a variation in reference current IREF according to supply voltage, respectively. The results shown in FIGS. 5A and 5B are obtained through simulations.

Referring to FIGS. 5A and 5B, the reference current IREF has a temperature coefficient of 68 ppm/° C. when the temperature changes from −25° C. to 100° C., and has a rate of change of 0.2%/V when the supply voltage changes from 2.4 V to 3.6 V.

Figure 6A:
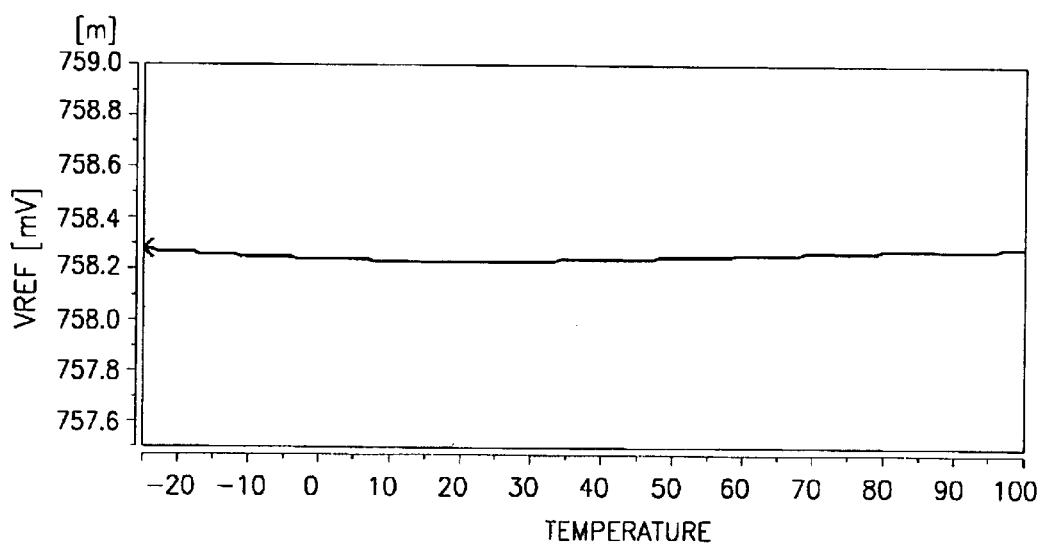
FIG. 6A is a graph illustrating a variation in reference voltage according to temperature.
Figure 6B:
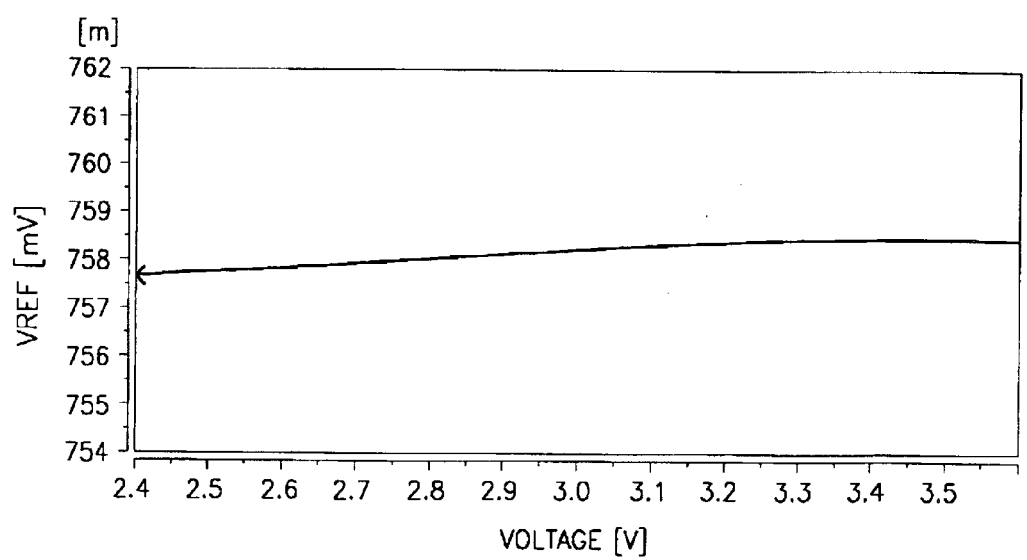
FIG. 6B is a graph illustrating a variation in reference voltage according to supply voltage.

FIGS. 6A and 6B are graphs illustrating a variation in reference voltage VREF according to temperature, and a variation in reference voltage VREF according to supply voltage, respectively. The results in FIGS. 6A and 6B are also obtained through simulations.

Referring to FIGS. 6A and 6B, the reference voltage VREF has a temperature coefficient of 0.6 ppm/° C. when the temperature changes from −25° C. to 100° C., and has a rate of change of 0.1%/V when the supply voltage changes from 2.4 V to 3.6 V. In conclusion, simulations reveal that the reference voltage VREF changes slightly in proportion to a variation in the supplied reference current IREF.

Figure 7:
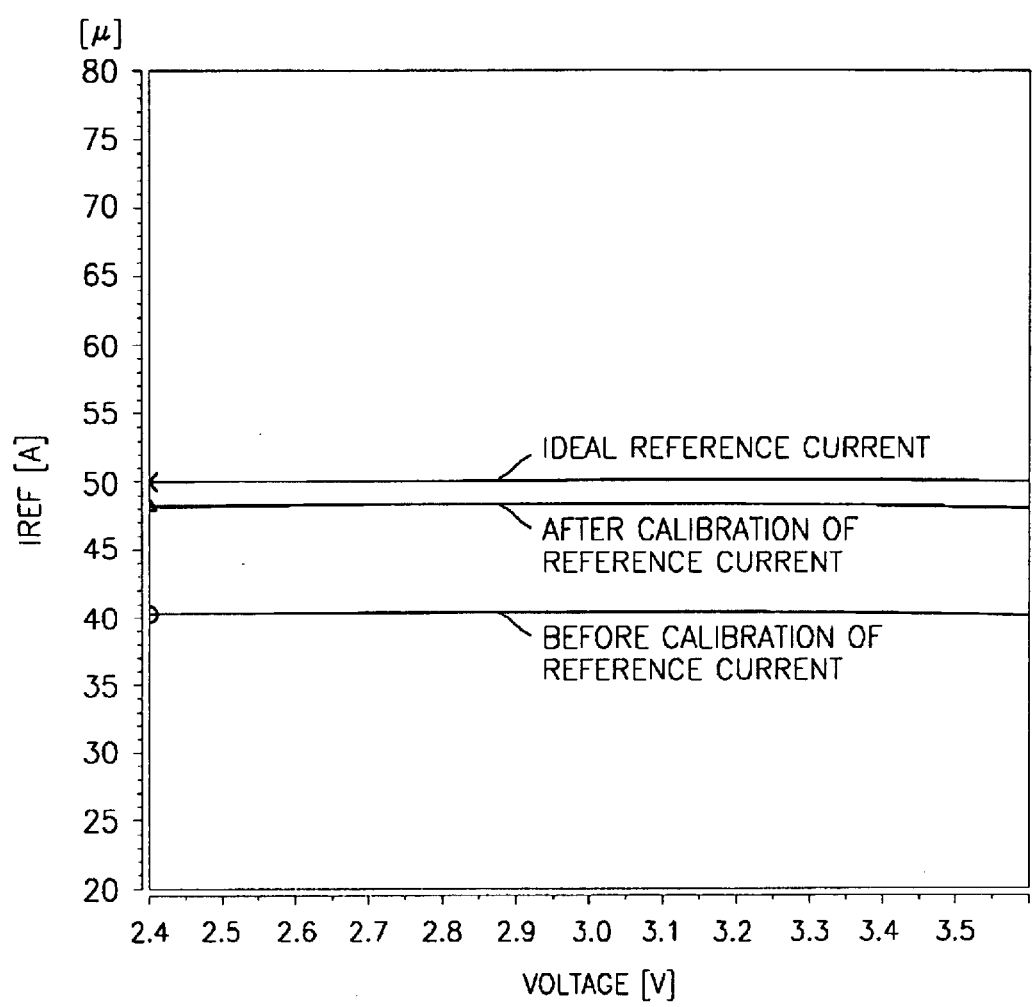
FIG. 7 is a graph illustrating a comparison of variations in reference voltage before and after the reference voltage is calibrated, according to supply voltage.

FIG. 7 is a graph illustrating a comparison of variations in reference current IREF before and after it is calibrated, according to supply voltage. More specifically, FIG. 7 illustrates the results of simulations before and after the reference current IREF is calibrated, in consideration of changes in process parameters during a process of manufacturing an integrated circuit according to the present invention. That is, FIG. 7 shows a variation in the reference current IREF when resistance in a reference current generating circuit 200 changes in a range of ±20%, and a variation in the reference current IREF after it has been calibrated. As a result, there is only an offset between the reference current IREF to be calibrated and the calibrated reference current IREF, and there are no remarkable changes in the reference current IREF.

Figure 8:
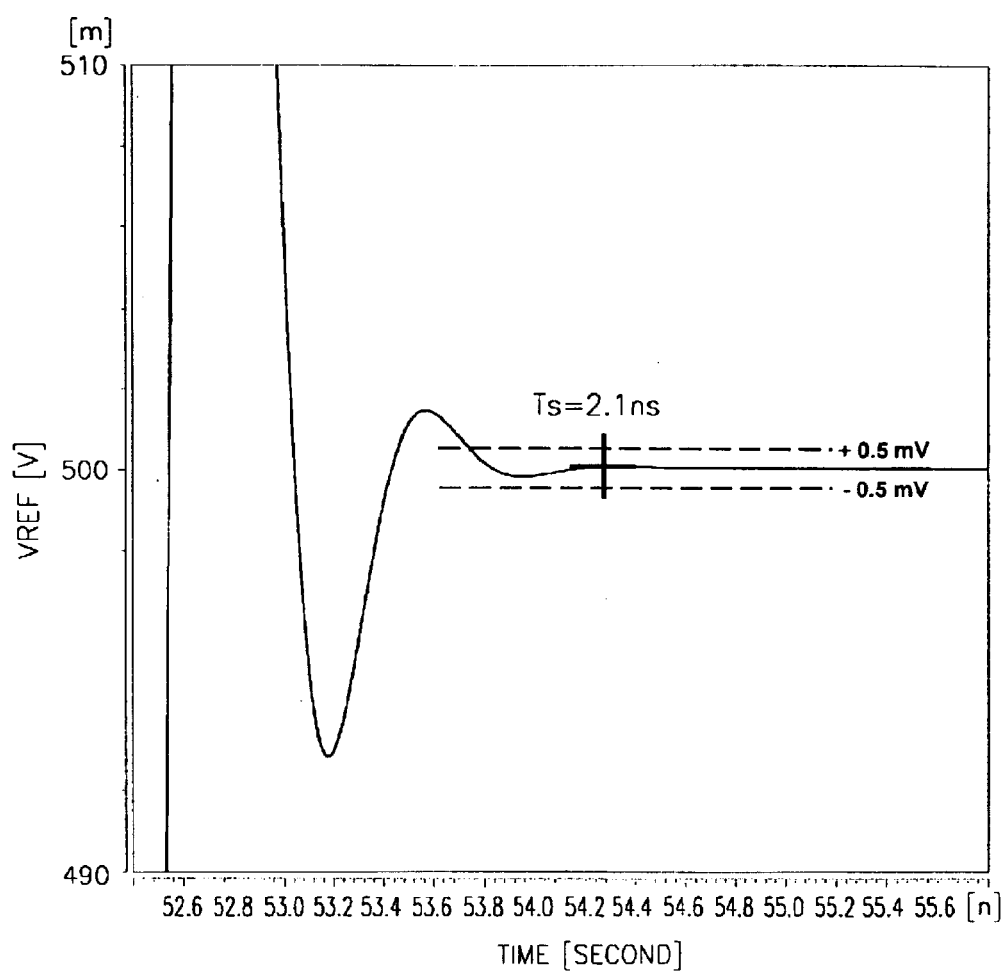
FIG. 8 is a waveform diagram of a voltage driving circuit.

FIG. 8 is a graph illustrating an output waveform of the voltage driving circuit 330 of FIG. 3 according to the present invention. Referring to FIG. 8, if a 10-bit A/D converter of 120 MHz is used as a load to the voltage driving circuit 330, an output waveform of the voltage driving circuit 330 (or a reference voltage driving circuit 331) should settle within 4.1 ns, which is 50% of the operational frequency of 120 MHz of the A/D converter, so as to stabilize the operation of the A/D converter.

However, in fact, the output waveform of the voltage driving circuit 330 (or the reference voltage driving circuit 331) settles within 2.1 ns considering the delay time of a clock signal and the settling time of internal circuits.

Figure 9:
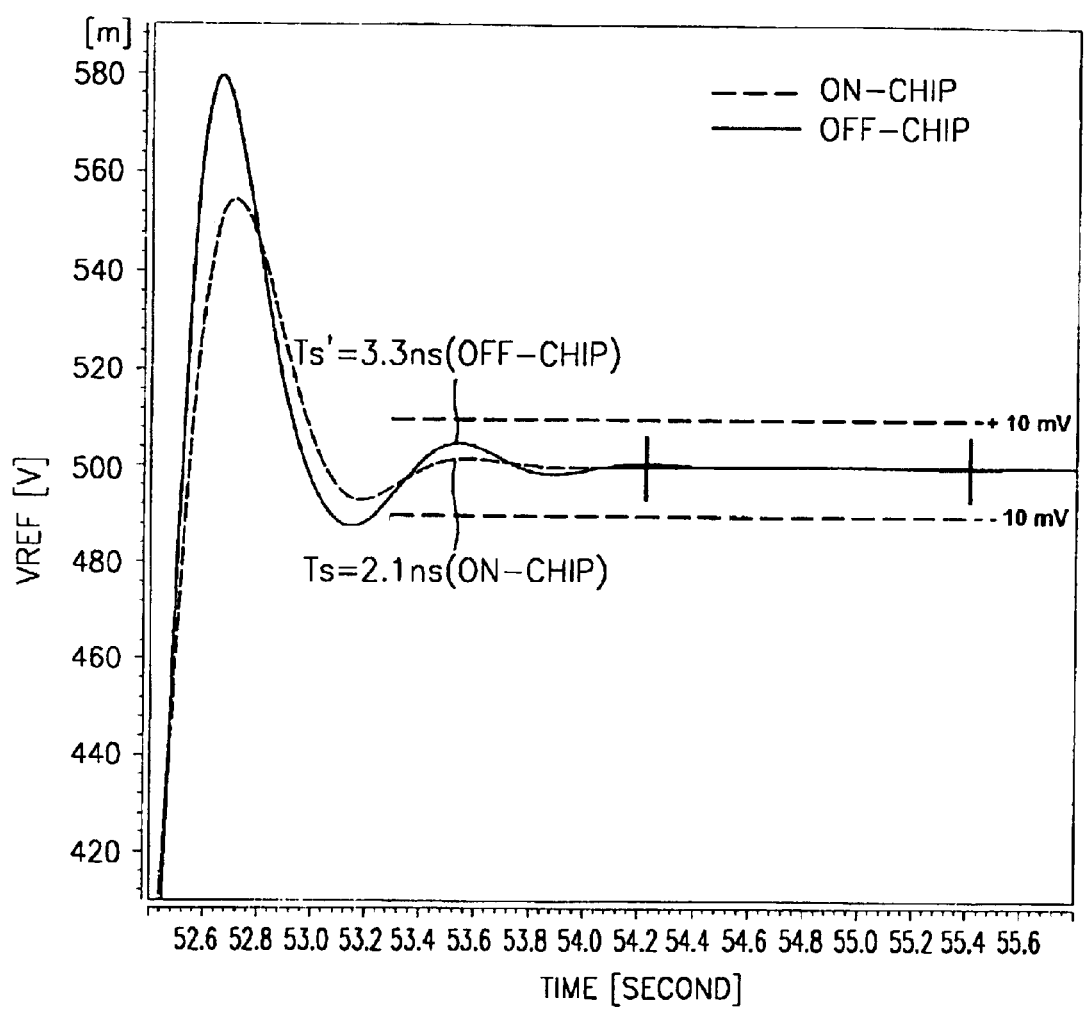
FIG. 9 illustrates waveform diagrams of reference voltages in on-chip reference current and voltage generating circuits, and reference voltages in off-chip reference current and voltage generating circuits.

FIG. 9 illustrates a waveform diagram of reference voltages in on-chip reference current and voltage generating circuits, and a waveform diagram of reference voltages in off-chip reference current and voltage generating circuits. Referring to FIG. 9, under the same conditions, voltage output from the on-chip reference voltage generating circuit has a shorter settling time than that of the voltage output from the off-chip reference voltage generating circuit.

FIG. 10 is a table illustrating the characteristics of on-chip reference current and voltage generating circuits according to embodiments of the present invention, which are obtained through simulations. Referring to FIGS. 1 and 10, the integrated circuit 100, which includes the reference current generating circuit 200 and the reference voltage generating circuit 300, is designed or used in the simulations, using a 0.35 μm n-well complimentary metal-oxide-semiconductor (CMOS) process. Here, the active-chip area of the integrated circuit 100 is 500 μm×300 μm.

When the integrated circuit 100 according to an embodiment of the present invention receives a supply voltage of 2.4 V to 3.6 V at a temperature of −25° C. to 100° C., the reference current IREF has a temperature coefficient of 68 ppm/° C. and a rate of change of ±0.2%/V, and the reference voltage VREF has a temperature coefficient of 0.6 ppm/° C. and a rate of change of +0.1%/V. In this case, the integrated circuit 100 uses 2.63 mW of power at a voltage of 2.75 V.

As described above, reference current and voltage generating circuits according to embodiments of the present invention are adapted for a high-speed composition mode integrated circuit and are capable of generating a reference current and/or reference voltage to a desired level, substantially irrespective of a change in temperature and/or supply voltage.

Also, a digitally controlled on-chip reference current generating circuit does not require an additional pin to generate an analog signal and thus, it is barely affected by outside noise input via the pin.

Further, a voltage driving circuit uses a low-voltage amplifier MPB and a capacitor having a small capacitance, thereby reducing the area of an integrated circuit. This also considerably reduces the power consumed by the integrated circuit.

An integrated circuit according to an embodiment of the present invention may be manufactured using a CMOS process, thereby reducing the manufacturing costs thereof. The operational speed of the integrated circuit is faster than off-chip reference current and voltage generating circuits.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An on-chip reference current generating circuit for outputting a steady reference current substantially irrespective of a change in temperature and/or supply voltage, the on-chip reference current generating circuit comprising:
   a generator circuit for receiving a first current having a negative temperature coefficient and a second current having a positive temperature coefficient, and outputting a third current based upon the first and second currents; and
   a digital calibration circuit for calibrating the third current to be the reference current in response to a digital control signal.

2. The on-chip reference current generating circuit of claim 1, wherein at least one of the first current and the second current change according to a change in temperature or supply voltage, respectively.

3. The on-chip reference current generating circuit of claim 1, wherein the digital control signal is an N-bit control signal input from the outside of the on-chip reference current generating circuit, where N is a natural number.

4. The on-chip reference current generating circuit of claim 1 further comprising an internal reference voltage generating circuit for receiving the reference current and generating an internal reference voltage corresponding to the reference current.

5. The on-chip reference current generating circuit of claim 4 further comprising a level shifter for generating a predetermined voltage by shifting the level of the internal reference voltage in response to the internal reference voltage; and
   a voltage driving circuit for converting the voltage output from the level shifter and outputting the reference voltage in response to an enable signal.

6. The on-chip reference current generating circuit of claim 1, wherein the generator circuit is a summing circuit that is operable to sum the first and second currents to form the third current.

7. An on-chip reference voltage generating circuit having an output terminal for outputting a reference voltage, the circuit comprising:
   a level shifter for generating a second voltage by shifting the level of a first voltage in response to the first voltage; and
   a voltage driving circuit for driving the second voltage to the reference voltage in response to an enable signal, wherein the voltage driving circuit comprises:
   an amplifier for comparing the reference voltage input to its first input terminal and the second voltage input to its second input terminal, and outputting the result of the comparison to its output terminal;
   an on-chip capacitor connected between the output terminal of the amplifier and the output terminal of the on-chip reference voltage generating circuit; and
   a common source amplifier for driving the reference voltage to the output terminal of the on-chip reference voltage generating circuit in response to a signal output from the amplifier.

8. An integrated circuit comprising:
   a summing circuit for receiving a first current, which increases in proportion to temperature, and a second current, which decreases in inverse proportion to temperature, and outputting a third current that is a sum of the first and second currents;
   a digital calibration circuit for calibrating the third current with reference to a predetermined reference current in response to a digital control signal and outputting a reference current; and
   an internal reference voltage generating circuit for receiving the reference current and generating an internal reference voltage corresponding to the reference current.

9. The integrated circuit of claim 8 further comprising:
   a level shifter for generating a predetermined voltage by shifting the level of the internal reference voltage in response to the internal reference voltage; and
   a voltage driving circuit for converting a voltage output from the level shifter into a predetermined reference voltage in response to an enable signal and outputting the reference voltage.

10. An integrated circuit comprising:
    a first current generating circuit for generating a first current that decreases in inverse proportion to temperature;
    a second current generating circuit for generating a second current that increases in proportion to temperature;
    a generator circuit for generating a third current based upon the first and second currents; and
    a digital calibration circuit for calibrating an offset between the third current and a reference current with reference to a predetermined reference current in response to a digital control signal input from the outside, and outputting the calibrated reference current.

11. The integrated circuit of claim 10 further comprising:
    a level shifter for generating a second voltage by shifting the level of a first voltage in response to the first voltage corresponding to a signal output from the digital calibration circuit; and
    a voltage driving circuit for converting the second voltage into a predetermined reference voltage in response to an enable signal, and outputting the reference voltage.

12. The integrated circuit of claim 11, wherein the voltage driving circuit comprises:
    an amplifier for comparing the reference voltage input to a first input terminal and the second voltage input to the second input terminal and outputting the result of the comparison to the output terminal of the amplifier,
    an on-chip capacitor connected between the output terminal of the amplifier and the output terminal of the on-chip reference voltage generating circuit; and
    a common source amplifier for outputting the reference voltage to the output terminal of the voltage driving circuit in response to a signal output from the amplifier.

13. The integrated circuit of claim 10, wherein the generator circuit is a summing circuit that is operable to sum the first and second currents to form the third current.

14. An on-chip reference voltage driving circuit having an output terminal for outputting a reference voltage, the circuit comprising:
    an amplifier for comparing the reference voltage, which is input to a first input terminal, and an input voltage input to a second input terminal and outputting the result of the comparison to the output terminal of the amplifier;
    an on-chip capacitor connected between the output terminal of the amplifier and the output terminal of the on-chip reference voltage driving circuit; and
    a common source amplifier for outputting the reference voltage to the output terminal of the on-chip reference voltage driving circuit in response to a signal output from the amplifier.

* * * * *